(12) United States Patent
Dierickx

(10) Patent No.: US 6,225,670 B1
(45) Date of Patent: May 1, 2001

(54) DETECTOR FOR ELECTROMAGNETIC RADIATION, PIXEL STRUCTURE WITH HIGH SENSITIVITY USING SUCH DETECTOR AND METHOD OF MANUFACTURING SUCH DETECTOR

(75) Inventor: Bart Dierickx, Mortsel (BE)

(73) Assignee: IMEC (BE)

( * ) Notice: Subject to any disclaimer, the term of this patent is extended or adjusted under 35 U.S.C. 154(b) by 0 days.

(21) Appl. No.: 09/021,010

(22) Filed: Feb. 9, 1998

(30) Foreign Application Priority Data

Jun. 4, 1997 (EP) .................................. 97870084

(51) Int. Cl.⁷ .................................................... H01L 29/72
(52) U.S. Cl. ..................... 257/431; 257/443; 257/450; 257/461; 257/463
(58) Field of Search ..................... 257/291, 292, 257/431, 443, 450, 461, 463

(56) References Cited

U.S. PATENT DOCUMENTS

| | | |
|---|---|---|
| 4,473,836 | 9/1984 | Chamberlain . |
| 4,565,756 | 1/1986 | Needs et al. . |
| 4,580,103 | 4/1986 | Tompsett . |
| 4,647,975 | 3/1987 | Alston et al. . |
| 5,101,253 * | 3/1992 | Mizutani et al. ...................... 357/30 |
| 5,146,074 | 9/1992 | Kawahara et al. . |
| 5,153,420 | 10/1992 | Hack et al. . |
| 5,164,832 | 11/1992 | Halvis et al. . |
| 5,258,845 | 11/1993 | Kyuma et al. . |
| 5,296,696 | 3/1994 | Uno . |
| 5,321,528 | 6/1994 | Nakamura . |
| 5,335,008 | 8/1994 | Hamasaki . |
| 5,608,204 * | 3/1997 | Hofflinger et al. . |
| 5,614,744 | 3/1997 | Merrill . |
| 5,841,126 | 11/1998 | Fossum . |
| 5,898,196 * | 4/1999 | Hook et al. .......................... 257/292 |

FOREIGN PATENT DOCUMENTS

| | | |
|---|---|---|
| 548 987 | 6/1993 | (EP) . |
| 657 863 | 6/1995 | (EP) . |
| 739 039 | 10/1996 | (EP) . |
| 2324651 | 10/1998 | (GB) . |
| 93/19489 | 9/1993 | (WO) . |

OTHER PUBLICATIONS

Aoki et al., "A Collinear 3–Cup Image Sensor", IEEE International Solid–State Circuits Conference, 1985, pp. 102–103.

Horii et al., "A 490×404 Element Imager for a Single–Chip Color Camera", IEEE International Solid–State Circuits Conference, 1985, pp. 96–97.

Nagakawa et al., "A 580×500–Element CCD Imager with a Shallow Flat P Well", IEEE International Solid–State Circuits Conference, 1985, pp. 98–99.

Mahowald, M.A., "Silicon Retina with Adaptive Photoreceptors", *SPIE*, vol. 1473, 1991, pp. 52–58.

Mann, J. "Implementing Early Visual Processing In Analog VLSI: Light Adaptation", *SPIE*, vol. 1473, 1991, pp. 128–136.

Ono et al., "Analysis of Smear Noise In Interline–CCD Image Sensor with Gate–Free Isolation Structure", Abstract of the 1991 Int'l Conference on Solid State Devices and Materials, Yokohama, 1991, pp. 68–70.

(List continued on next page.)

Primary Examiner—Edward Wojciechowicz
(74) Attorney, Agent, or Firm—Knobbe, Martens, Olson & Bear, LLP.

(57) ABSTRACT

The present invention discloses a semiconductor based detector for radiation with a small but effective barrier between the radiation sensitive volume in the semiconductor and the regions and junctions with readout circuitry, and with no or a lower barrier between the semiconductor substrate and the regions and junctions adapted and meant for collecting the charge carriers generated by the radiation in the semiconductor substrate.

27 Claims, 6 Drawing Sheets

OTHER PUBLICATIONS

Yadid–Pecht et al., "A Random Access Photodiode Array for Intelligent Image Capture", *IEEE Transactions on Electron Devices*, vol. 38, No. 8 Aug. 1991.

Ricquier et al., "Pixel Structure with Logarithmic Response for Intelligent and Flexible Imager Architectures" *Microelectronic Engineering*, 19 (1992), pp. 631–634.

Sevenhans, et al., "A 400mm Long Linear X–Ray Sensitive Image Sensor", IEEE International Solid–State Circuits Conference, 1987, pp. 108–109.

Anderson, S. et al., "A Single Chip Sensor & Image Processor or Fingerprint Verification", IEEE 1991 Custom Integrated Circuits Conference, May 12–15, 1991, pp. 12.1.1–12.1.4.

Diertickx, Bart, "XYW Detector: A Smart Two–Dimensional Particle Sensor", *Nuclear Instruments and Methods in Physics Research A275*, North–Holland Physics Publisihing Division, 1989, pp. 542–544.

Klein, P., "Design and Performance of Semiconductor Detectors with Integrated Amplification and Charge Storage Capability", *Nuclear Instruments and Methods in Physics Research A305*, 1991, pp. 517–526.

Aw, Chye Huat, et al., "A 128×128–Pixel Standard–CMOS Image Sensor with Electronic Shutter", *IEEE Journal of Solid State Circuits*, vol. 31, No. 12, Dec. 1996, pp. 1922–1930.

Martin, W.J. et al., "Dynamic Offset Null", *IBM Technical Disclosure Bulletin*, No. 23, No. 9, Feb. 1981, pp. 4195–4196.

* cited by examiner

DETECTOR FOR ELECTROMAGNETIC RADIATION, PIXEL STRUCTURE WITH HIGH SENSITIVITY USING SUCH DETECTOR AND METHOD OF MANUFACTURING SUCH DETECTOR

FIELD OF THE INVENTION

The present invention relates to the field of semiconductor based detectors for electromagnetic radiation. In particular a semiconductor detector and a semiconductor pixel structure for detecting electromagnetic radiation with a large radiation sensitive area or a high fill factor are disclosed. The present invention also relates to a method of manufacturing such detector.

BACKGROUND OF THE INVENTION

Semiconductor based sensors and devices for detecting electromagnetic radiation are known in the art. Examples of such sensors are disclosed in EP-A-739039 and in W093/19489. These sensors are implemented in a semiconductor substrate in CMOS- or MOS-technology. In these sensors, the regions adapted for collecting charge carriers being generated by the radiation in the semiconductor substrate are forming a p-n or a n-p junction with the substrate that is of a n type conductivity or p type conductivity respectively. Such junctions are called collection junctions. Among the image sensors implemented in CMOS- or MOS-technology, CMOS or MOS image sensors with passive pixels and CMOS or MOS image sensors with active pixels are distinguished. The sensors of EP-A-739039 and W093/19489 are active pixel sensors.

An active pixel is configured with means integrated in the pixel to amplify the charge that is collected on the light sensitive element or component in the pixel. Passive pixels do not have said means and require a charge-sensitive amplifier that is not integrated in the pixel and is connected with a long line towards the pixel. Due to the additional electronics in the active pixel, an active pixel image sensor may be equipped to execute more elaborated functions, which can be advantageous for the performance of the imaging device or system based on the sensor. Said functions can include filtering, operation at higher speed or operation in more extreme illumination conditions. It remains however a main drawback of active pixel CMOS or MOS image sensors, and to a lesser extent also of passive pixel sensors, that a significant part of the surface of the pixel is used for readout circuitry.

It is known that the charge sensitive volume of a p-n or n-p junction is larger than the depletion layer of the junction. In fact all charges generated within a so called recombination length from the collection junction have a chance of diffusing to that junction and of being collected. Based on this mechanism it is possible to make a sensor with a small junction and yet a large photosensitive volume. Photosensors can be made with junctions of 3 by 2 micrometers and with a recombination length of 15 $\mu$m. Thus such detector has an apparent front size or photosensitive region of 30 $\mu$m diameter. However if a non-related electronic circuitry such as readout circuitry is placed in the neighborhood of such collection junction, part of the charges that otherwise would have reached the collection junction will be collected by junctions or components of the readout circuitry. The charge carriers generated by light falling on the regions of the detector that are used for readout circuitry therefore are mainly collected by the junctions of this readout circuitry. The area taken by the readout circuitry in the pixels therefore is lost for collecting the radiation and this is essentially the reason for the low fill factor or low sensitivity of active pixel based sensors.

The book "Solid-State Imaging with Charge Coupled Devices", of A. Theuwissen (Kluwer Academic publishers, 1995 ISBN 0-7923-3456-6) gives an overview of the present state of the art of semiconductor based imaging devices, such as CCDs and MOS cameras. Chapter 7 of this book is devoted to the topic of increasing the sensitivity or the effective fill factor of a pixel. It covers such methods as the use of micro lenses or the use of a photo conversion top layer.

In the article "XYW detector a smart two-dimensional particle detector," by Bart Dierickx, published in Nuclear Instruments and Methods in Physics Research, vol. A275 (1989), p.542–544, FIG. 4 shows 4 methods to fabricate semiconductor based pixel devices. The first method is based on classic CMOS processing. The disadvantage of this method is quoted to be a low fill factor, since part of the semiconductor surface is occupied by readout electronic circuitry. The other methods attempt to solve the fill factor problem by using non-standard-CMOS techniques: flip-chip (bump bonding), SOI (silicon-on-insulator) technology, or moving the photon-sensitive zone to an amorphous top-layer.

In the article "Design and Performance of semiconductor detectors with integrated amplification and charge storage capability," by P. Klein & al, published in Nuclear Instruments and Methods in Physics Research, vol. A305 (1991) pp. 517–526, FIG. 2 shows a semiconductor based sensor with a transistor junction wherein the charges being generated in the semiconductor substrate are prevented from diffusing into the source and drain junctions of the transistor by a junction-based barrier and are constrained to the gate, the gate being in contact with the source and drain.

Avalanche photo diodes (ADPs) are also known in the art. An APD can consist of a structure having layers in a sequence $p^{++}/p^-/p^+/n^{++}$, where the p++ layer is the backside contact, the p– layer is a detection layer, the p+ layer is serving for avalanche multiplication of electrons, and the n++ layer is finally the collection layer of the multiplicated electrons. The dopant level and width of the multiplication layer is very critical. Furthermore the applied voltage over such a structure is rather high, close to the electric breakdown of the structure. The p-/p+ layer transition is not acting as a barrier for the diffusion of electrons, but as an avalanche multiplication device.

Aim of the Invention

It is an aim of the present invention to disclose a semiconductor based device for detecting electromagnetic radiation wherein substantially all of the charge carriers being generated by said radiation in the semiconductor are collected into the collection junctions and regions, instead of into regions and junctions of the readout circuitry.

Summary of the Invention

The present invention relates first to a detector for electromagnetic radiation which includes a semiconductor substrate, said substrate comprises a first region and a second region, said first region and said second region being adapted for collecting charge carriers being generated by said radiation in said substrate. Said substrate further comprises a third region forming a barrier for substantially impeding the diffusion of said charge carriers to said second region.

In between the substrate and the first region, there is no barrier present or a substantially zero barrier present or a substantially lower barrier than in between said second region and said substrate.

Said third region can also form a substantially lower barrier for the diffusion of said charge carriers to said first region.

More particularly, the present invention relates to a semiconductor based detector for radiation with a small but effective barrier between the radiation sensitive volume in the semiconductor substrate and the regions and junctions with readout circuitry, and with no or a lower barrier between the radiation sensitive volume in the semiconductor and the regions and junctions adapted and meant for collecting the charge carriers being generated by the radiation.

According to a first aspect of the present invention, the detector can be such that at least part of the charge carriers that are generated in said substrate adjacent to, and preferably underneath, said second region are collected by said first region. Said substrate can have dopants of a first conductivity type, said first region and said second region having dopants of the other and second conductivity type, said third region having dopants of said first conductivity type, the doping level of said third region being higher than the doping level in said substrate.

According to another aspect of the present invention, said first region forms a junction with said substrate, and said second region forms a junction with said third region.

According to a further aspect of the present invention, a MOS based pixel structure for detecting light comprising the detector of the present invention is disclosed. In this case, said third region forms an electrostatic barrier for substantially impeding the diffusion of electrons or holes to said second region. Said electrostatic barrier can be formed at the interface between said third region and said substrate.

A substantially lower electrostatic barrier for the diffusion of electrons or holes from said substrate to said first region is formed at the interface between said first region and the substrate. Said second region can be part of a circuit for processing the signal being generated by said charge carriers in said first region. This signal can be the current being generated in said first region. The pixel structure can further comprise a fourth region adjoining said first region and said substrate, the substantially lower barrier then being formed at the interface between said fourth region and the substrate.

In other aspects of the present invention a method of manufacturing and a method of operating a CMOS based pixel structure for detecting electromagnetic radiation are disclosed.

The present invention further comprises the aspects of design integration of the principle of the invention in CMOS based pixel structures and sensors and in CCD's or CCD-like structures. The present invention advantageously can be applied in sensors for low-noise light detection applications.

DETAILED DESCRIPTION OF THE INVENTION

Figure 1A:
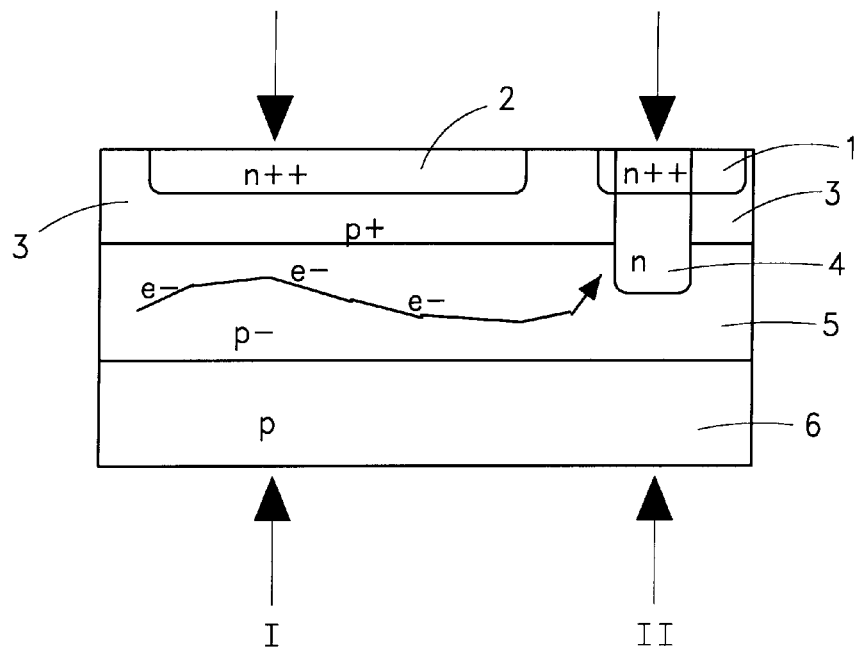
FIGS. 1a and 1b schematically show the detector of the invention according to a first and a second embodiment.

The present invention discloses a semiconductor based detector for radiation with a small but effective barrier between the radiation sensitive volume in the semiconductor substrate and the regions and junctions with readout circuitry, and with no or a lower barrier between the radiation sensitive volume in the semiconductor and the regions and junctions adapted and meant for collecting the charge carriers being generated by the radiation. The region forming the barrier in between the radiation sensitive volume wherein charges are created and the unrelated electronics of the readout circuitry, can have dopants of the same conductivity type as the radiation sensitive volume.

The detector of the present invention can comprise a collection junction, which collects radiation generated charge carriers, and other electronic components. Said collection junction has an enhanced collection for charge carriers that are generated in the radiation sensitive volume underneath said other electronic components. Such functionality is made by means of an electrostatic barrier, that is formed at the interface of the volume and a region with the same conductivity type as said volume underneath said other electronic components. The barrier prevents the charge carriers which are generated underneath said other electronic components from diffusing into the junctions or structures of said other electronic components. This electrostatic barrier is not, or with a substantially lower height, present underneath the collection junction, which can consequently gather the charge carriers that are generated under the other electronics components.

This detector can be realized in a CMOS process, wherein the components are realized in a p type substrate, the region forming the electrostatic barrier is realized as a p+ type implant, and the other components are of various type, including n type junctions. The collection junction is formed by a n type region with a low electrostatic barrier to the substrate. The area of lower (or absent) barrier may coincide with the collection junction, overlap it completely or partly, or be a part of it. The lower (or absence of) barrier can be realized by an additional n type implant in the area of the collection junction, or by the absence of the p+ type implant which realizes said electrostatic barrier.

Said p+ type implant can be a so-called pwell implant, or a so called anti-punch through implant, or a so-called blanket implant, or a so-called $V_{th}$-adjust implant, which have all about the same effect in a CMOS process, and which are in many cases available as a standard step in a CMOS process.

Said n type implant can be an implant such as a so-called nwell implant, or a so called anti-punch through implant, or a so-called blanket implant, or a so-called $V_{th}$-adjust implant.

In an alternative embodiment of the invention, the detector forms part of a pixel structure wherein the collection junction (with the deeper n type implant, or with the absence of the p+ p– barrier) is realized as one electrode (source or drain) of a MOSFET, and the other electrode is tied to a certain voltage. The precise voltage is not relevant: the only condition is that the other electrode should not be a floating node. The collection junction should be completely (preferred) or partially surrounded by the gate of said MOSFET; the other electrode then surrounds (wholly or partially) the gate and first electrode. The gate of the MOSFET is biased "off", so that both electrodes are electrically isolated. The fact that the MOSFET gate and other electrode surround the junction will reduce the part of the dark current that is due to junction edge effects.

The principle of the invention can be applied to a CCD or CCD-like structure (photo gate, charge injection device (CID), charge sweep device(CSD)) where the collecting junction is an inversion layer or buried channel beneath a CCD-electrode (thus a surface channel CCD or a buried channel CCD. The collection junction (or part thereof) can be thought to be replaced by such structure.

In a way of explaining the invention, the invention is described in the sequel by means of the example of a CMOS based light sensitive sensor with a pixel structure such as disclosed in EP-A-0739039. The teaching of EP-A-0739039 is incorporated herein by reference. In the example being described in the sequel, it is assumed that the semiconductor substrate is of a p type conductivity. It is obvious that the person skilled in the art will imagine equivalent structures to those described in the sequel that have a semiconductor substrate of a n type conductivity. Also other equivalent embodiments will be obvious for the person of skill in the art, the spirit and scope of the present invention being limited only by the terms of the appended claims.

FIG. 1a schematically shows part of a pixel structure with the semiconductor substrate (6) having a p type doping. A p– layer or region (5) is defined in said substrate. The substrate can be of a uniform p– or p++ doping either in alternate embodiments. The p– layer can be defined by diffusion or by ion implantation or epitaxial growth or other techniques known in CMOS based processing. An additional p+ layer or region (3) is defined on or in the p– layer/substrate (5). The p+ region (3) can be defined by diffusion or by ion implantation or epitaxial growth or other techniques known in CMOS based processing. In the p+ region (3) a first region (1) and a second region (2) are defined. These first and second regions are of a n type doping. These first and second regions can be defined by ion implantation or diffusion or other techniques known in CMOS based processing. These first and second regions form a junction with the p type based regions and/or substrate. The first region (1) is to be a collection junction for collecting the charge carriers being generated by radiation in the substrate and/or p– region (6, 5). According to the example, the collection junction is a photodiode. The second region (2) is to form a junction being part of readout circuitry for processing the signals being generated by the charge carriers being collected by said first region (1). An additional, optional n type fourth region (4) can be defined and can overlap completely or partially said first region (1). This fourth region extends from said first region to said p– layer (5) and/or to said substrate (6). This fourth region by preference is defined by a deep ion implantation step but may also be defined by other techniques known in CMOS based processing.

Figure 1B:
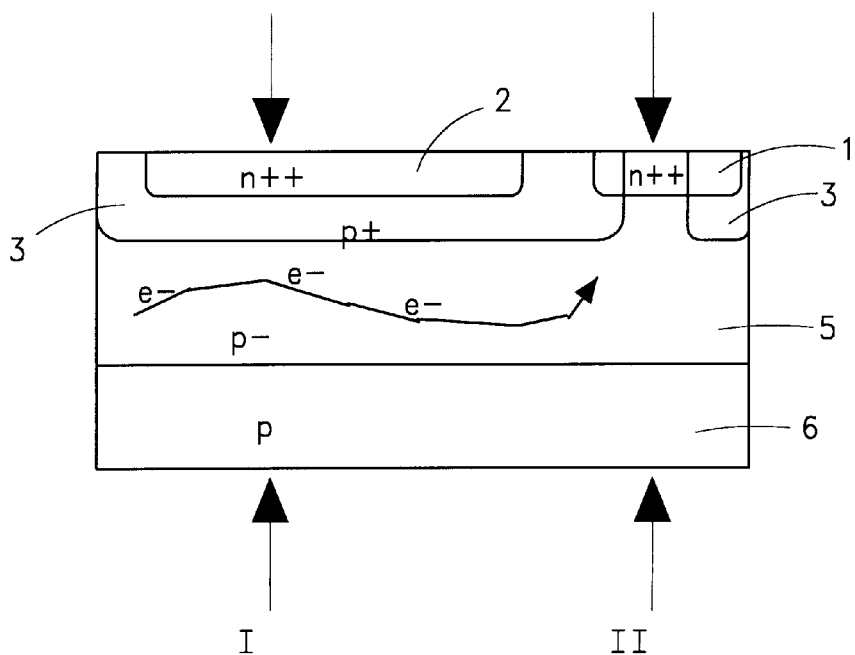

FIG. 1b shows an alternate embodiment of the structure shown in FIG. 1a.

Figure 2:
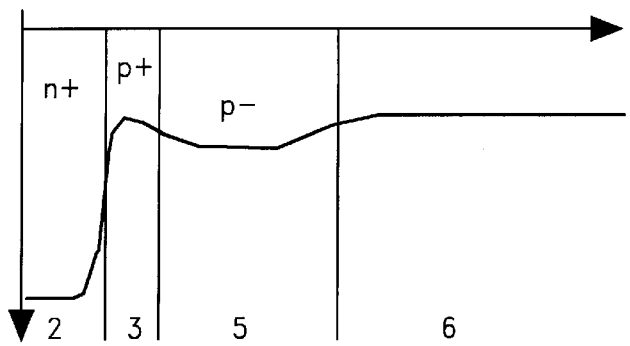
FIG. 2 represents the electrostatic potential in the detector as shown in FIG. 1a according to the cross sections along line I.
Figure 3:
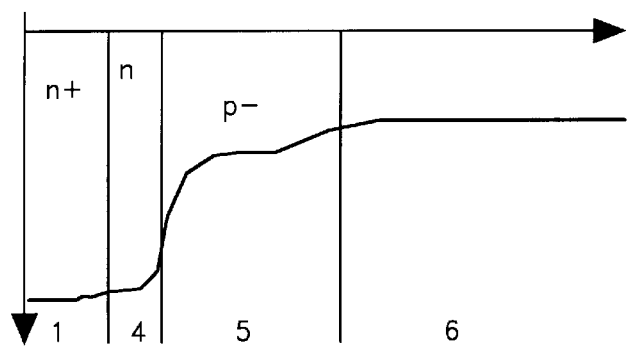
FIG. 3 represents the electrostatic potential in the detector as shown in FIG. 1a according to the cross sections along line II.

FIGS. 2 and 3 show the electrostatic potential in the structure as shown in FIG. 1 according to cross-sections following lines I and II respectively. In the structure shown in FIG. 1 there is a local potential minimum in the p– region, as indicated in FIGS. 2 and 3. As shown in FIG. 2, electrons in the p– region(s) will not diffuse easily to the second region (2), as there is an electrostatic barrier at the interface (3/5) created by the p+ region (3). According to FIG. 3, electrons will not be impeded by a barrier between the p– region (5) and the n+ region(1). The electrons in zone "I" will diffuse sidewards to the zone "II", and be collected in the first region (1).

Figure 4:
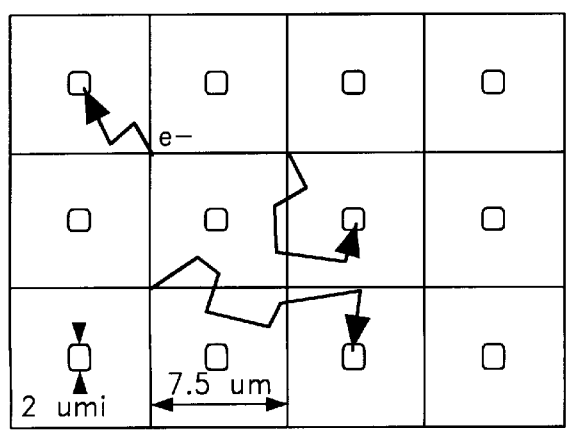
FIG. 4 shows a simulation of the diffusion of charge carriers in the structure as schematically shown in FIG. 1a according to Monte-Carlo-simulations.

The diffusion of charge carriers in the structure as schematically shown in FIG. 1 was simulated according to Monte-Carlo-simulations. Such simulation is represented in FIG. 4. The "random walk" of electrons that are generated by radiation in a matrix of pixels according to the present invention was simulated. The pixel were manufactured according to the structure shown in FIG. 1a. The average diffusion distance of the electrons was recorded. In a structure wherein the fourth region (4) is not present (thus, a prior art structure), the diffusion distance is large and the electrons diffuse over several pixel distances before being collected or being recombined with a hole. In a structure having the fourth region (4), the electrons are collected much faster, as shown in the table below. A pixel matrix with pixels on a pitch of 7.5×7.5 micrometer was simulated, and in each pixel first and fourth regions of various size were present. Electrons are in a worst case scenario generated at the edge point between 4 pixels.

| size of collecting junction (1,4) | diffusion distance in x ($\sigma_x$) |
|---|---|
| region (4) absent | 15.5 $\mu$m |
| 1 $\mu$m | 6.1 $\mu$m |
| 2 $\mu$m | 4.5 $\mu$m |

The resulting diffusion distances come close to the ideal result (3.75 $\mu$m). This kind of pixels have thus a near-ideal Modulation Transfer Function (MTF). It has also a near 100% fill factor, which means that all surface of the pixel matrix that is exposed to light contributes to the light collection. Substantially, all of the substrate charge carriers generated by the light will flow to the collection junction. In prior art pixel structures, parts of the generated charge carriers are collected by the junctions of readout circuitry, and such charge is thus lost.

The introduction of the region (3) has several effects, two of these are:

the photo diodes (1,4–5,6) collect photo charge from the whole pixel and may reach a 100% fill factor. The photo diodes collect photo charge from the whole pixel, the fill factor only being limited by mainly 3 factors:

light trapped inside the junctions of the readout circuitry themselves. This is certainly a limitation for short wavelength light, which has a low penetration depth;

light reflected by the interconnect metallization;

recombination; free electrons will not diffuse indefinitely, but recombine after some typical recombination length; in a CMOS technology, this length turns out to be several times the pixel pitch.

the sharpness or MTF of the image.

In the case that a region (3) is present between the substrate and the collection junctions (1), region (3) forming a barrier for the diffusion of charge carriers at the region(3)/substrate interface, this will prevent an easy collection of charge carriers by the collection junction (1). The free carriers will have time to diffuse to neighboring pixels and are eventually collected or recombined there, and cause thus an unsharp image. The omission of such barrier by the definition of region (4) in the photo diode tends to confine the photo charge.

PREFERRED EMBODIMENT OF THE INVENTION

In a standard CMOS process two (a,b) small arrays of photo diodes were fabricated as part of an integrated circuit. In case (a), the junctions are like prior art shallow n type regions in a p type substrate. The junctions measure 2×2 μm, the pixel pitch is 7.5 μm. A central row of the pixel array is exposed to light, neighboring rows of pixels are covered from the light by a metal shield. The parallel outputs of rows of pixels are taken outside the integrated circuit, so that the effective photo current of a row of pixels can be measured. In case (b), the structure is identical, except that in every photo diode, a small 2×2 μm nwell implant is made inside the photo diode. It must be noted that the CMOS process used here features a so-called pwell, which is a complementary implant to the nwell. Any area not exposed to the nwell implant is implanted with a p type dopant, to enhance the p type concentration close to the surface. The resulting structure is the preferred embodiment of the detector according to the schematic drawing of the invention in FIG. 1a. In the ideal case, the exposed row of pixels should detect all photo current, and the covered rows should deliver zero current. The fact that this is not the case is mainly due to sidewards diffusion of charges and to optical diffraction.

Figure 5:
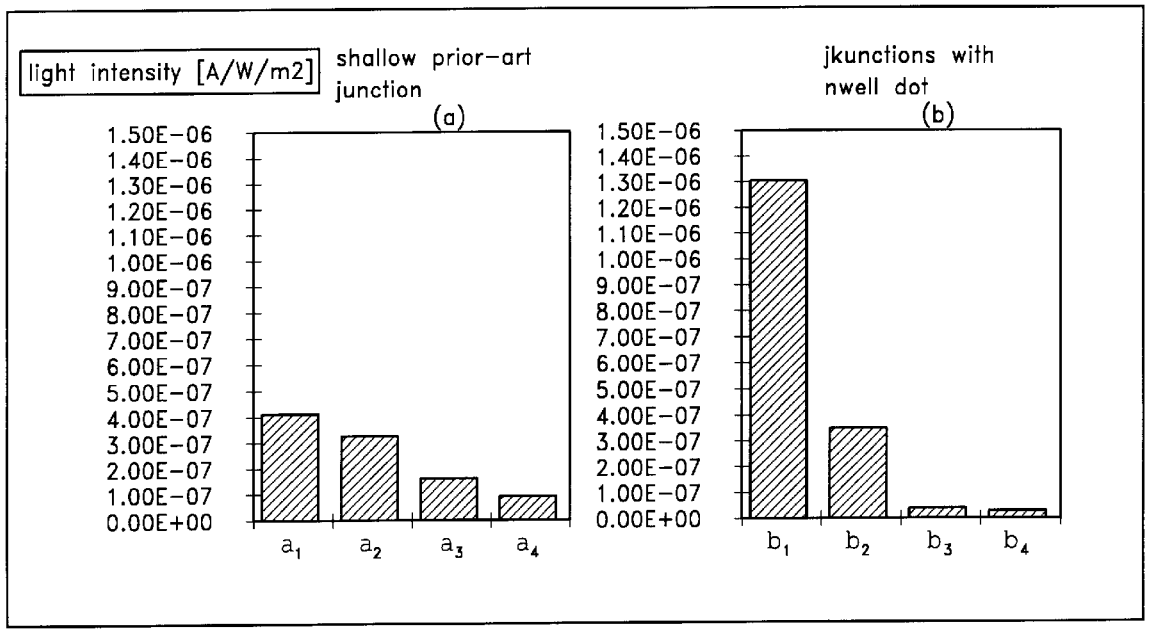
FIGS. 5a and 5b show results measured on sensors being manufactured according to the present invention (5b) and on sensors being manufactured according to the prior art (5a).

Measurements are summarized in FIG. 5, for both cases (a: prior art) and (b: with regions and junctions according to the invention). In the results shown in FIG. 5, "a1/b1" is the current collected by the exposed pixels, "a2/b2" by the (covered) neighbor pixel , "a3/b3" by the neighbor pixel thereafter, and "a4/b4" is the sum of the current collected by 4 successive neighbor pixels thereafter. The change of behavior by the effect of the nwell dots as shown in FIG. 5(b) proves the principle of the invention. Not only does the central exposed pixel row collect relatively more photo current (b1), but also the absolute level of the total current is much higher, which indicated that structure (b) collects current which is otherwise lost by recombination of charge carriers in structure (a).

Other realizations on various types of active pixels showed an even more prominent difference. As preferred embodiment, we used the 3 transistor pixel structure as disclosed in EP-A-0739039. Adding a small dot of nwell inside the photo diode increased the collected current dramatically, with a factor 5 to 10, for light of 650 nm. Considering the fact that the pixels were designed with a 15% fill factor (area of the exposed photo diode only), then this factor of 5 to 10 indicates that the fill factor is to be close to 100%.

Advantages of the detector of the invention further include:
photo charge being generated by light falling on areas of the pixel that are not covered by photo diode junctions are collected by the photo diode junctions, even if this area is covered by readout circuitry including junctions that can collect photo-generated charges too. The pixels of the invention have a near complete (100%) fill factor, except for those parts that are covered by opaque material as metal interconnections. The charge that is generated inside junctions of unrelated circuitry of course is lost for detection. As these junctions are shallow, radiation of wavelengths beyond about 500–600 nm is converted to electron-hole pairs deep in the silicon substrate, and this effect causes only a minor lowering of the sensitivity.

The capacitance of the collection junction of the detector of the invention is considerably smaller than the capacitance of a junction that would cover the full pixel surface, yet they have effectively the same light collecting surface. One of the main noise sources in imaging sensors is the so-called kTC-noise. This noise is typically expressed as an amount of noise charge (uncertainty of the measurements of the photo charge), and is proportional to the square root of the capacitance of the junction. In order to obtain a pixel with a low noise charge, one must design low capacitance photo diodes. Yet, for a given capacitance per unit area, the lowest noise diode has also the smallest area, and thus a low light collecting area. The present invention allows to make photo diodes which have a small junction area and small junction capacitance, but with a large collecting volume.

The devices of the preferred embodiment of the invention can be implemented in a custom CMOS technology with the possibility of performing implantations that are being adjusted so that the required profiles are present. The structure of the invention can be obtained even in standard CMOS technology. There are foundries which have a feature in their CMOS process called "twin well". Other foundries have similar structures but call them differently: Anti-punch-through implant, blanket implants, $V_{th}$-adjust implant etc. The principle is the same, and can be used in the same way for realizing the preferred embodiment of the present invention. In a twin well CMOS process, both NMOS and pMOS structures are fabricated in their own well (respectively pwell and nwell). In the sequel it is assumed that the silicon substrate is (relatively) lowly doped p type, or a lowly doped p type epitaxial layer on top of a highly doped wafer. pMOS structures are processed in a nwell, which is a deep junction in the substrate. nMOS structures are processed in a pwell, which in this case is not a junction (as it is of the same type as the substrate, being in this example a p type substrate, but nevertheless the result is that the NMOS structures are processed in a part which is higher doped than the substrate beneath. This and similar structures have been introduced in order to allow shorter channel transistors in a standard CMOS process. The present invention can be realized by using a n-junction as the light collecting junction, and to pierce the p+/p− barrier by overlaying part (or the whole) of the n-junction with a nwell implant. The nwell implant is deep, and protrudes through the pwell into the lowly doped substrate. The eventual other nMOSFETs which are part of the active (or passive) pixel, are made with shallow junctions only, and do not protrude into the substrate. It is to be noted that if the complexity of the active pixel requires that it should contain pMOSFETS, thus to be processed in a nwell, then this nwell—being the same type of junction as in the light collecting junctions—will compete with the light collecting junction, and cancel its effect partly. This problem does not occur in active pixels that use only one type of MOSFET. In a custom process, this situation can be alleviated by having an even deeper p type implant for the nwell over the pMOSFETS, and not for the photo collection junctions.

Junction spiking is known as an effect wherein the metallization spikes through a shallow junction. This is one of the causes of high dark-current pixels. By putting the critical diode contact above a well, which is possible in the pixels of the present invention, the leakage to the substrate is avoided. This will yield an overall lower number of white pixels in a pixel matrix.

Alternative Embodiments of the Present Invention

The photocollecting junction of a pixel in a CMOS based sensor, according to the invention, can be a depletion layer or an inversion layer of a MOS-structure or a buried channel MOSFET.

The photocollecting junction can also be a phototransistor, said phototransistor can be fabricated as a vertical pnp structure wherein the collector is the substrate, the base is the deep nwell implant, and the emitter is a p type region forming a shallow junction inside this well. Such a structure has similar charge collection properties as the preferred embodiment of the invention but it has the added value of internal current multiplication.

Pixel with Integral Memory Element

Figure 6:
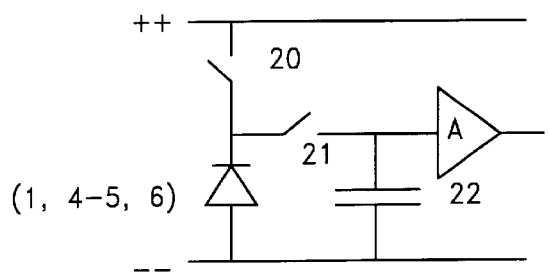
FIG. 6 shows a pixel structure according to the invention which has a memory element in the pixel.

The present invention can applied to make a pixels which have a memory element in the pixel, the memory element being better shielded from the light. An analog memory element is usually a capacitor, which has a part or parts which are junctions, or which has connections to other circuit elements such as transistors which have junctions. Junctions are light sensitive, and this light sensitivity will cause a current to flow which will affect the charge stored on the capacitor. A memory element or capacitor can be used for various purposes: spatial and temporal filtering, the memorization of an image, etc. FIG. 6 shows an example of a circuit where a frame that is acquired with a slow integration time, can be read out in a non-destructive way at high speed. In this figure, the light collection junction (1,4–5,6) can be reset by switch (e. g. a MOSFET) (20). The signal being acquired in the light collection junction can be periodically sampled by switch (21) on capacitor (22). This voltage is then multiplexed in the classical ways over circuits represented as "A". The circuit of FIG. 6 should, in order to operate properly, have a stable signal on capacitor (22). Capacitor (22), and also the interconnections to it should be shielded from the light, which is straightforward by using metallization. However, Capacitor (22), and/or the interconnections to it may also collect charge that is present in the substrate due to light generation. Especially photo charge that is being created deep in the substrate can diffuse easily onto Capacitor (22) or its interconnections, and discharge them. If the photo diode (1,4–5,6) is made according to the present invention, the charge diffusing in the substrate will likely be collected in the photodiode (1,4–5,6) and will thus not affect the charge on Capacitor (22).

Figure 7:
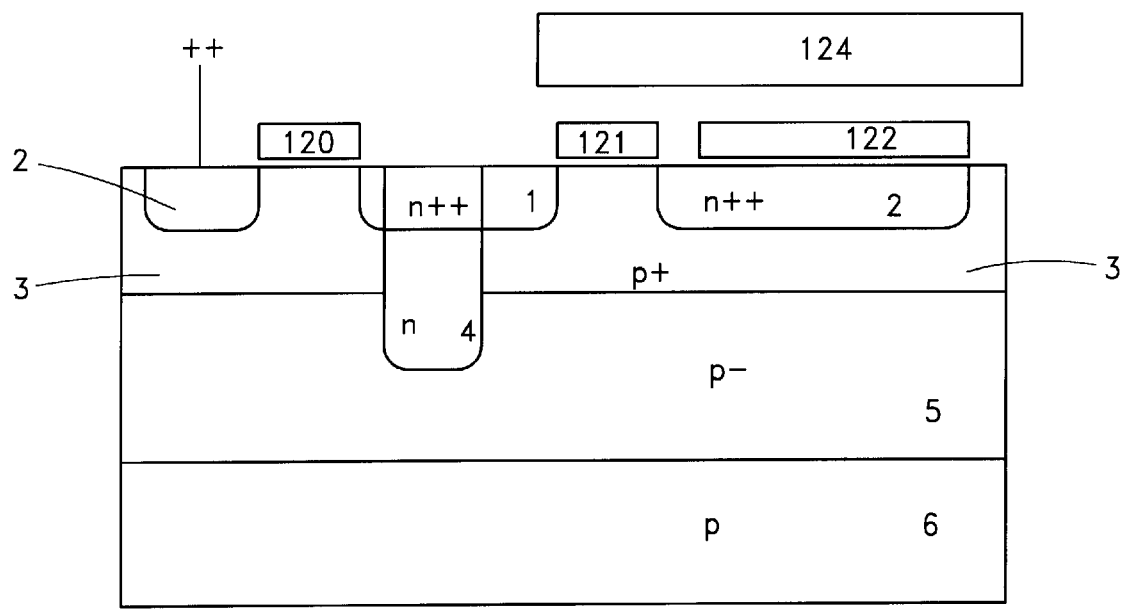
FIG. 7 shows a cross section in the semiconductor substrate of a possible implementation of the pixel structure of FIG. 6.

A cross section of a possible implementation is show in FIG. 7. Here the capacitor and switches are realized as MOS structures with a metal light shield (124) being deposited on the capacitor region, a dielectric being in between the metal shield (124) and the metal or polysilicon gate of the switches (121) (120) and of the capacitor (122); the amplification and multiplexing circuitry is not shown.

The Application of the Well-Pixel to Obtain a Pixel with Low Dark Current

It is known in the art that the photodiode dark current is mainly due to thermal generation mechanisms at the edges of the diode, or at the interface between the Silicon and $SiO_2$. In CCD's the dark current can be significantly reduced by a method called "inversion mode" or "all phase pinning". In such a CCD, the Si-SiO₂ interface of the CCD is brought into inversion, so that the buried channel (the useful detecting volume) is not in contact any more with this interface. The methods reduces the dark current with a factor of typically 100.

The well-pixel of the present invention can be applied with the same goal. If the pixel is large compared to the light collection junction, the other area is to be covered with a structure that screens the bulk of the material from the surface. Two ways to do this are:
(a) using a screening junction (32);
(b) using an inversion layer (132), induced by a polysilicon gate electrode (37).

Figure 8:
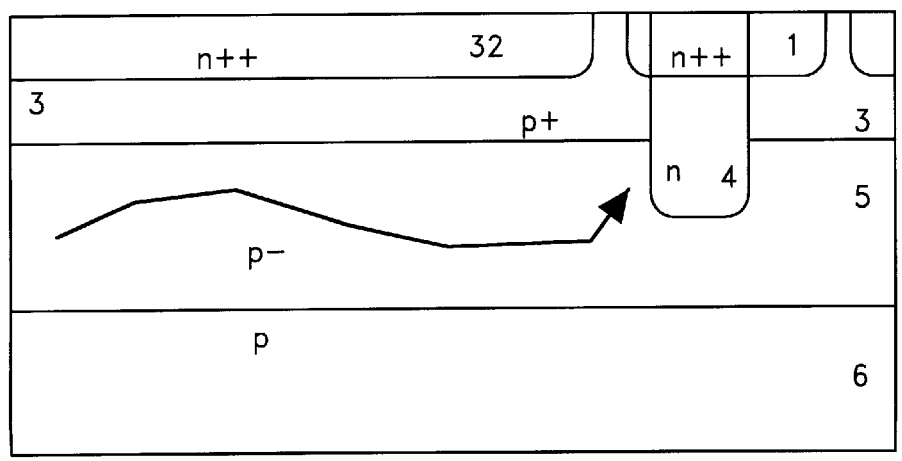
FIG. 8 shows the detector of the invention applied in a first low dark current pixel.

An example of (a) is shown in FIG. 8.

Figure 9:
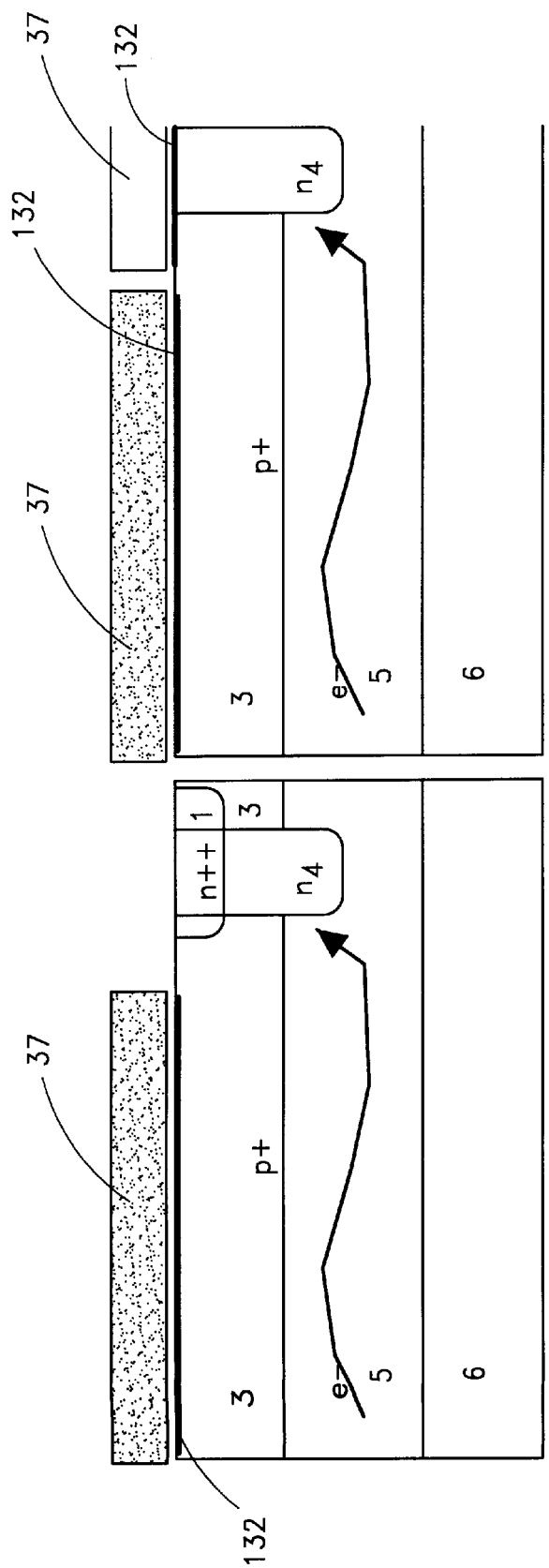
FIG. 9 shows the detector structure of the invention applied in a second low dark current pixel.

Two examples of (b) are shown in FIG. 9 wherein is shown a polysilicon gate electrode (37) inducing a screening inversion layer (132) in the barrier region (3).

On the Implementation in a CCD or CCD-Like Structure

Figure 10:
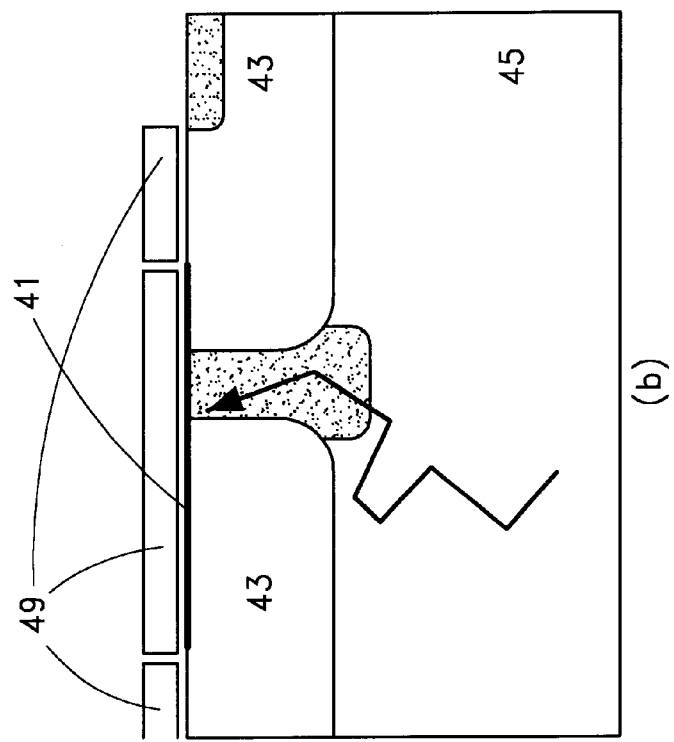
FIG. 10 shows two cross sections of surface channel CCD-like structures according to the principle of the invention.
Figure 10:
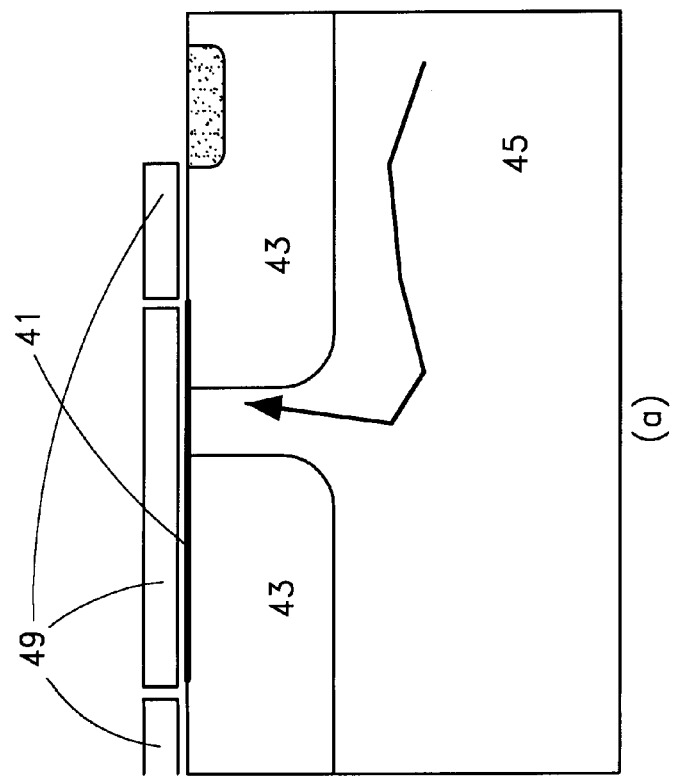

The invention is applicable to any active or passive pixel structure, and even to CCD-structures (see FIG. 10). The photocollection junction of the present invention can be a photo diode, but also a junction that consists essentially of a depletion layer or inversion layer (41) to the semiconductor substrate(45) (as in a surface channel CCD), or that consists essentially of a (partially) depleted buried channel to the semiconductor substrate or surface (as in a buried channel CCD). Such structures are typically used in CCDs, CIDs (charge injection devices), photo gates, or similar. These are called "virtual junctions," as they have in fact the same functionality as a physical n-p junction while collecting photo-generated charge carriers.

A CCD cell can thus be the light sensitive element itself, where the photo charge is collected in a potential pocket that is electrostatically induced by the CCD electrodes (49). If a potential barrier is present between the photosensitive volume (the substrate (47)) and the potential pocket, this will prevent the collection of charges. The present invention can thus be used to enhance the charge collection of the virtual junction. In FIG. 10 are shown two cross sections of surface channel CCD-like structures, where the barrier for electrons from the substrate to reach the inversion layer (41) of the CCD is suppressed: a) by an opening (omission) of the pwell (43) b) by an explicit n type implant (44) according to the principle of the invention that pierces or lowers said potential barrier.

What is claimed is:

1. A detector for electromagnetic radiation including a semiconductor substrate having dopants of a first conductivity type, wherein said substrate comprises a first region and a second region both having dopants of a second conductivity type, said first region and said second region being adapted for collecting charge carriers being generated by radiation in said substrate, said substrate further comprising a third region having dopants of the first conductivity type at a higher doping level than the substrate, the third region forming a barrier for substantially impeding the diffusion of said charge carriers to said second region.

2. A detector as recited in claim 1, wherein said substrate comprises a first region, a second and a third region, said first region and said second region and possibly said third region are exposed to radiation.

3. A detector as recited in claim 1, wherein between the substrate and the first region, there is no barrier present or a substantially zero barrier present or a substantially lower barrier than in between said second region and said substrate.

4. A detector as recited in claim 1, wherein said third region is forming a substantially lower barrier for the diffusion of said charge carriers to said first region.

5. A detector as recited in claim 1 having a small but effective barrier between the radiation sensitive volume in the semiconductor substrate and the regions and junctions with read-out circuitry with no or a lower barrier between the radiation sensitive volume in the semiconductor and the regions and junctions adapted and meant for collecting the charge carriers being generated by the radiation.

6. The detector as recited in claim 1, wherein at least part of the charge carriers that are generated in said substrate underneath said second region are collected by said first region.

7. The detector as recited in claim 6, wherein said first region forms a junction with said substrate and said second region forms a junction with said third region.

8. The detector as recited in claim 7, wherein said first region is part of a phototransistor.

9. The detector as recited in claim 8, wherein said phototransistor is a vertical npn structure or vertical pnp structure, and wherein said substrate is the collector of said phototransistor, said first region is the base of said phototransistor, said first region further comprising a fifth region being the emitter of said phototransistor.

10. The detector as recited in claim 1, further comprising a fourth region adjoining said first region and said substrate, said fourth region having dopants of said second conductivity type.

11. The detector as recited in claim 1, being integrated in a CCD or in a CCD-like sensor and wherein said first region is an inversion layer or a buried channel beneath the electrode of said CCD or said CCD-like sensor.

12. The detector as recited in claim 11, wherein said CCD-like sensor is a photogate or a charge injection device or a charge sweep device.

13. A MOS based pixel structure for detecting light comprising the detector as recited in claim 1, wherein said third region forms an electrostatic barrier for substantially impeding the diffusion of electrons or holes to said second region, said barrier being formed at the interface between said third region and said substrate.

14. The pixel structure as recited in claim 13, wherein in between the substrate and the first region, there is no barrier present or a substantially zero barrier present or a substantially lower barrier than in between said second region and said substrate.

15. The pixel structure as recited in claim 13, said third region is forming a substantially lower barrier for the diffusion of said charge carriers to said first region.

16. The pixel structure as recited in claim 13, wherein a detector having a small but effective barrier between the radiation sensitive volume in the semiconductor substrate and the regions and junctions with read-out circuitry with no or a lower barrier between the radiation sensitive volume in the semiconductor and the regions and junctions adapted and meant for collecting the charge carriers being generated by the radiation.

17. The pixel structure as recited in claim 13, wherein said first region is a depletion layer or an inversion layer of a MOS component or of a buried channel MOS transistor.

18. The pixel structure as recited in claim 13, wherein said second region is part of a circuit for processing the signal being generated by said charge carriers in said first region.

19. The pixel structure as recited in claim 13, wherein said substrate is a p type substrate, said third region being a p type region of a higher doping level, said first and said second region being n type regions.

20. The pixel structure as recited in claim 19, further comprising a fourth region adjoining said first region and said substrate and wherein said fourth region is a n type region.

21. The pixel structure as recited in claim 19 or 20, wherein said first region is the first electrode of a MOS transistor, said first junction being at least partially surrounded by the gate of said MOS transistor, the second electrode surrounding at least partially said gate and said first electrode.

22. The pixel structure as recited in claim 21, wherein said first electrode is the source or the drain of said MOS transistor, said second electrode being the drain or the source of said MOS transistor.

23. The pixel structure as recited in claim 13, wherein said pixel structure further comprises a memory element.

24. The pixel structure as recited in claim 13, wherein said memory element comprises a capacitor, the charge being generated in said first region being stored on said capacitor over a switch, at least a part of said capacitor being shielded from said radiation by a protecting metal layer on top of said pixel structure.

25. A method of operating the pixel structure as recited in claim 22, comprising the step of electrically isolating said first and said second electrode.

26. The method as recited in claim 25, further comprising the step of tying said second electrode to a voltage in a predetermined range, said gate being biased in the "off" state.

27. A detector as recited in claim 1, further comprising a metallisation contact, said contact being on said first region.

* * * * *

UNITED STATES PATENT AND TRADEMARK OFFICE
CERTIFICATE OF CORRECTION

PATENT NO. : 6,225,670 B1
DATED : May 1, 2001
INVENTOR(S) : Bart Dierickx

It is certified that error appears in the above-identified patent and that said Letters Patent is hereby corrected as shown below:

Column 1,
Line 8, insert:
-- This application is related to and claims the benefit of the filing date of prior filed U.S. Provisional Patent Application No. 60/037,531 filed October 2, 1997. --.

Signed and Sealed this

Twenty-seventh Day of December, 2005

JON W. DUDAS
*Director of the United States Patent and Trademark Office*